US012402282B2

(12) United States Patent
Li (10) Patent No.: US 12,402,282 B2
(45) Date of Patent: Aug. 26, 2025

(54) LIQUID COOLING UNIT (71) Applicant: CONTEMPORARY AMPEREX TECHNOLOGY (HONG KONG) LIMITED, Hong Kong (CN)

(72) Inventor: Qing Li, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 306 days.

(21) Appl. No.: 18/343,834

(22) Filed: Jun. 29, 2023

(65) Prior Publication Data

US 2023/0345674 A1 Oct. 26, 2023

Related U.S. Application Data (63) Continuation of application No. PCT/CN2022/097112, filed on Jun. 6, 2022.

(30) Foreign Application Priority Data

Nov. 15, 2021 (CN) .......................... 202122794342.3

(51) Int. Cl.
*H01M 10/6551* (2014.01)
*H01M 10/615* (2014.01)
(Continued)

(52) U.S. Cl.
CPC ..... *H05K 7/20381* (2013.01); *H05K 7/20327* (2013.01)

(58) Field of Classification Search
CPC .................................................. H01M 10/06
See application file for complete search history.

(56) References Cited

U.S. PATENT DOCUMENTS

2002/0037454 A1* 3/2002 Tsuruta ................ H01M 4/383
429/218.2

FOREIGN PATENT DOCUMENTS

CN 204885359 U 12/2015
CN 205194809 U 4/2016
(Continued)

OTHER PUBLICATIONS

Machine translation of CN105720319A from Espacenet (Year: 2016).*

(Continued)

*Primary Examiner* — Maria Laios
*Assistant Examiner* — Zackary Richard Cochenour
(74) *Attorney, Agent, or Firm* — Ladas & Parry LLP (57) ABSTRACT A liquid cooling unit includes a first flow divider/combiner, a second flow divider/combiner, a plate heat exchanger, a radiator and a heater. The plate heat exchanger, the radiator and the heater are connected in parallel between a flow dividing end of the flow divider/combiner and a flow combining end of the second flow divider/combiner. The flow dividing end of the first flow divider/combiner outputs a fluid into the plate heat exchanger, the radiator or the heater. The plate heat exchanger and the radiator cool the fluid, and the heater heats the fluid. The flow combining end of the second flow divider/combiner receives the fluid outputted by the plate heat exchanger, the radiator or the heater, and the flow dividing end of the second flow divider/combiner outputs the fluid to a battery for thermal management of the battery. The flow combining end of the first flow divider/combiner receives the fluid.

9 Claims, 3 Drawing Sheets (51) Int. Cl.
*H01M 10/66* (2014.01)
*H05K 7/20* (2006.01)

(56) References Cited

FOREIGN PATENT DOCUMENTS

| | | |
|---|---|---|
| CN | 105720319 A | 6/2016 |
| CN | 205355204 U | 6/2016 |
| CN | 207624868 U | 7/2018 |
| CN | 213212309 U | 5/2021 |
| CN | 216529039 U | 5/2022 |
| WO | 2020213536 A1 | 10/2020 |

OTHER PUBLICATIONS

International Search Report for International Application No. PCT/CN2022/097112, mailed Aug. 17, 2022.
Written Opinion of International Searching Authority for International Application No. PCT/CN2022/097112, mailed Aug. 17, 2022.
Extended European Search Report for EP application No. 22891427.1, dated Jun. 12, 2024.

\* cited by examiner

LIQUID COOLING UNIT

CROSS REFERENCE TO RELATED APPLICATIONS

This application is a continuation of International Patent Application No. PCT/CN2022/097112, filed on Jun. 6, 2022, which claims the priority of Chinese Patent Application No. 202122794342.3, filed on Nov. 15, 2021. The disclosures of the aforementioned patent applications are incorporated herein in by reference in their entirely.

TECHNICAL FIELD

The application relates to the technical field of liquid cooling device, and more particularly relates to a liquid cooling unit.

BACKGROUND

To improve the power supply performance of batteries, a plurality of batteries are usually connected in series or in parallel to form a battery pack for use. However, the plurality of batteries electrified simultaneously will cause a heating phenomenon, and particularly in a high-temperature environment, the heating phenomenon is more severe, which may result in combustion and even explosion thanks to overheat of the batteries. Thus, there is a severe potential safety hazard.

Water cooling uniformly and stably takes away heat of the batteries through a water flow, which is a frequently used cooling mode. However, existing water cooling structures often occupy large space and are poor in cooling efficiency. Therefore, it is an urgent need of a water cooling device with high cooling efficiency.

SUMMARY

Embodiments of the application provide a liquid cooling unit which is capable of providing various cooling modes and connecting different cooling devices in parallel, thereby improving the cooling efficiency of the liquid cooling unit.

The embodiments of the application provide a liquid cooling unit, including a first flow divider/combiner, a second flow divider/combiner, a plate heat exchanger, a radiator and a heater, where the plate heat exchanger, the radiator and the heater are connected in parallel between a flow dividing end of the flow divider/combiner and a flow combining end of the second flow divider/combiner; the flow dividing end of the first flow divider/combiner is configured to output a fluid into at least one of the plate heat exchanger, the radiator and the heater; the plate heat exchanger and the radiator are configured to cool the fluid, and the heater is configured to heat the fluid; the flow combining end of the second flow divider/combiner is configured to receive the fluid outputted by at least one of the plate heat exchanger, the radiator and the heater, and the flow dividing end of the second flow divider/combiner is configured to output the fluid to a battery for thermal management of the battery; and the flow combining end of the first flow divider/combiner is configured to receive the fluid after thermal management of the battery.

It is to be noted that the above thermal management refers to cooling or heating the battery through the fluid.

In some embodiments, the liquid cooling unit further includes a compressor, a condenser and a cooling fan, where the compressor, the condenser, the plate heat exchanger and the cooling fan are configured to cool a refrigerant; and where a refrigerant pipeline connected to the compressor, the condenser and the plate heat exchanger are integrally welded.

In the above implementation modes, the compressor, the condenser, the radiator and the plate heat exchanger are connected by utilizing integrally formed refrigerant pipelines by welding to form an integrated compressor refrigeration model, so that the numbers of the refrigerant pipelines and other parts assembled are reduced, and the installation efficiency of the liquid cooling unit is improved.

In some embodiments, the liquid cooling unit further includes a fluid chamber, where the fluid chamber is a closed fluid chamber and is configured to provide a fluid to the second flow divider/combiner.

It should be understood that the fluid chamber provided by the application can also be known as a water tank, the name of which is not defined herein.

In the above implementation modes, the fluid chamber provides a cooling fluid to the pipeline through the second flow divider/combiner. By adopting the closed fluid chamber, it can be ensured that a cooling fluid system is sealed during operation, which is beneficial to guaranteeing cleanness, stability and long-term action of the cooling fluid.

In some embodiments, the liquid cooling unit further includes a water pump, where the water pump is configured to output the fluid to the battery.

In some embodiments, the water pump is a brushless direct current water pump. Without carbon brush friction, the brushless direct current water pump does not generate sparks and features high efficiency, low power consumption, long service life compared with the brush motor and low noise.

In some embodiments, there are a plurality of heaters.

In the above implementation modes, the number of the heaters can be set according to an actual demand. For example, in a case where the battery is in an environment with relatively low environment temperature, the plurality of heaters can be arranged and are connected in parallel between the first flow divider/combiner and the second flow divider/combiner to jointly heat the battery, so as to improve the heating efficiency of the liquid cooling unit.

In some embodiments, the plate heat exchanger, the radiator and the heaters are connected to the first flow divider/combiner and the second flow divider/combiner through rubber hoses.

It is to be noted that the pipelines connecting the plate heat exchanger, the heat radiator, the heaters, the fluid chamber, the water pump, the first flow divider/combiner and the second flow divider/combiner in the liquid cooling unit all are rubber hoses to form a cooling fluid loop of the liquid cooling unit.

In the above implementation modes, corresponding numbers of heaters and water pumps can be connected according to the actual demand of thermal management of the battery, so that the installation flexibility of parts in the liquid cooling unit is improved.

In some embodiments, the first flow divider/combiner and the second flow divider/combiner both are provided with normally closed drain valves, configured to conduct drainage and exhaust of a connecting pipeline connected to the first flow divider/combiner and the second flow divider/combiner.

In some embodiments, the first flow divider/combiner and the second flow divider/combiner both are integrally formed by welding.

In some embodiments, in a case where an environment temperature is lower than a first threshold, the cooling fan is started to cool the fluid inside the radiator.

It should be understood that to start the cooling fan is to cool the cooling fluid inside the radiator, so as to cool the battery. In default, the water pump cools the cooling fluid only in the started state. The power consumption of the cooling fan and the water pump working jointly is far less than that of the compressor refrigeration module. Power of the cooling fan and the water pump is usually hectowatt, and the electric power of the compressor refrigeration module is higher than kilowatt. Therefore, to start the cooling fan and the water pump for cooling may reduce the power consumption of the liquid cooling unit.

In the above implementation mode, in a case where the external air temperature is lower than the temperature of the cooling fluid in the cooling fluid loop, for example, in a case where the environment temperature is lower than a certain threshold, the radiator and the water pump can be started forcibly. The cooling fan ventilates to cool the cooling fluid so as to assist the system for cooling, so that the power consumption of the unit is reduced.

In the embodiments of the application, by designing the parallel structure among the plate heat exchanger, the radiator and the heaters, the liquid cooling unit can select different devices to work according to the demand of the battery on thermal management. In some embodiments, the battery can be jointly cooled through branches of the plate heat exchanger and the radiator, so that the cooling efficiency of the liquid cooling unit is improved.

BRIEF DESCRIPTION OF DRAWINGS

To describe the technical solutions of the embodiments of the application clearer, drawings needed to be used in the embodiments of the application will be briefly described below. Apparently, the drawings described below are only some embodiments of the application. Those of ordinary skill in the art can further obtain other drawings according to the drawings without making creative efforts.

DETAIL DESCRIPTION

The technical solutions in the embodiments of the application are described below in combination with drawings.

The embodiments of the technical solutions of the application will be described in detail below in combination with drawings. The embodiments below are merely used to more clearly describe the technical solutions of the application, merely as examples, instead of limiting the scope of protection of the application.

Unless otherwise defined, all technical and scientific terms used herein are identical to meaning commonly understood by those skilled in the art of the application. The terms used herein are merely used to describe specific embodiments rather than limiting the application. The terms "include" and "have" and any variation thereof in the description, claims and the above description of drawings of the application are intended to cover non-exclusive inclusion.

In description of the application, terms "first", "second" and the like are merely used to distinguish different objects rather than being construed to indicate or imply relative importance or implicitly indicate the quantity, specific order or primary and secondary relation of indicated technical features. In the description of the application, "a plurality of" means two or more, unless expressly specified otherwise.

The "embodiments" in the application mean that specific features, structure or characteristics described in combination with the embodiments may be included in at least one embodiment of the application. The phrase emerges in each position of the description is not necessarily the same embodiment or independent or alternative embodiments mutually exclusive to other embodiments. Persons skilled in the art explicitly and implicitly understand that the embodiments described herein may combine with other embodiments.

In the description of the application, the term "and/or" is only an association relationship describing associated objects and represents that three relationships may exist. For example, A and/or B may represent three conditions: i.e., independent existence of A, existence of both A and B and independent existence of B. In addition, character "/" in the disclosure usually represents that previous and next associated objects form an "or" relationship.

In the description of the application, term "a plurality of" means more than two (including two), and similarly, "a plurality of groups" means more than two groups (including two groups), and "a plurality of sheets" means more than two sheets (including two sheets).

In the description of the application, orientation or position relations indicated by the technical terms "central", "longitudinal", "transverse", "length", "width", "thickness", "upper", "lower", "front", "back", "left", "right", "vertical", "horizontal", "top", "bottom", "inner", "outer", "clockwise", "anticlockwise", "axial", "radial", "circumferential", and the like are orientation or position relations based on the drawings only for ease of description of the application and for simplicity of description, and are not intended to indicate or imply that the referenced device or element must have a particular orientation and be constructed and operative in a particular orientation, and thus may not be construed as a limitation on the present application.

In the description of the application, unless otherwise specified and defined, the technical terms such as "mount", "connect", "connection" and "fix" shall be understood in a board sensor. For example, it can be either fixed connection or detachable connection or integrated connection; either mechanical connection or electrical connection with each other; either direct connection or indirect connection through an intermediate, and communication in two components or interaction relaxation of the two components.

Those of ordinary skill in the art can understand specific meaning of the terms in the disclosure under specific circumstances. The batteries are usually used as a plurality of batteries are connected in series or in parallel to form a battery pack, so as to enhance the power supply performance of the batteries. Box batteries have ultra-high capacities. However, the plurality of batteries electrified simultaneously will cause a heating phenomenon, the various heating phenomena of the battery pack is more severe, which may result in combustion and even explosion thanks to overheat of the batteries. Thus, there is a severe potential safety hazard, which affects the service lives of the batteries. Current cooling modes for batteries are usually divided into two types. An air cooling mode mainly relies on external cold air to take away heat on the surfaces of the batteries to cool the batteries. The process is affected by many uncertain factors such as air speed of an air flow and is likely to cause non-uniform radiation, thereby resulting in low refrigerating and heating efficiencies. A water cooling mode cools the batteries as a water flow takes away heat of the batteries, and this mode features high stability. However, current water cooling structures or systems often have the problem of large occupied area and low cooling efficiency, and with respect to part type liquid cooling unit, parts thereof need to be installed and connected on site in a power station, so that the field installation and maintenance difficulty and cost are improved.

Aiming at the above problems, the embodiments of the application provide a liquid cooling unit. All parts are integrated in an integrated unit to solve the problem of cold leakage caused by large occupied space of the current water cooling structures, so that the radiating efficiency of the battery pack is improved. In addition, the integrated liquid cooling unit is free of field installation, so that the field installation and maintenance difficulty and cost are lowered. The liquid cooling unit provided by the application is suitable for thermal management of various batteries or battery packs, so that the temperature of the batteries or battery packs can be controlled in a reasonable range.

Figure 1:
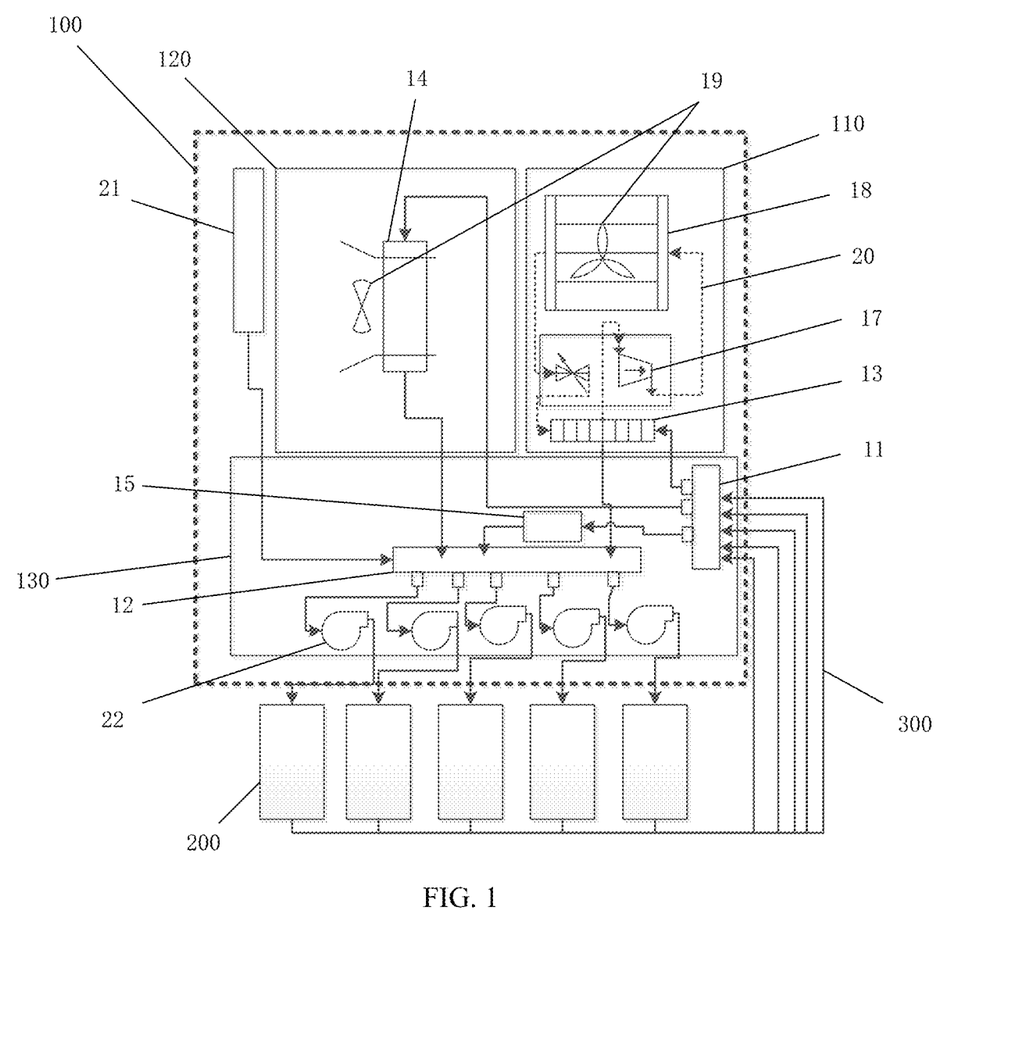
FIG. 1 is a block diagram of a liquid cooling unit provided in some embodiments of the application.

FIG. 1 is a structural diagram of a liquid cooling unit 100 provided by the embodiments of the application for thermal management of the battery 200. The liquid cooling unit 100 includes a first flow divider/combiner 11, a second flow divider/combiner 12, a plate heat exchanger 13, a radiator 14 and a heater 15, where the plate heat exchanger 13, the radiator 14 and the heater 15 are connected in parallel between a flow dividing end of the flow divider/combiner 11 and a flow combining end of the second flow divider/combiner 12; the flow dividing end of the first flow divider/combiner 11 is configured to output a fluid into at least one of the plate heat exchanger 13, the radiator 14 and the heater 15; the plate heat exchanger 13 and the radiator 14 are configured to cool the fluid, and the heater 15 is configured to heat the fluid; the flow combining end of the second flow divider/combiner 12 is configured to receive the fluid outputted by at least one of the plate heat exchanger 13, the radiator 14 and the heater 15, and the flow dividing end of the second flow divider/combiner 12 is configured to output the fluid to a battery 200 for thermal management of the battery 200; and the flow combining end of the first flow divider/combiner 11 is configured to receive the fluid after thermal management of the battery 200.

The first flow divider/combiner 11 and the second flow divider/combiner 12 can be also known as flow divider/combiner valves. The flow divider valves play a role of supplying a same flow (equally divided) to more than two execution elements from a same oil source in a hydraulic system or supplying a flow (proportionally divided) to the two execution elements in a certain proportion, so as to keep synchronization of speeds of the two execution elements or keep a definite proportion relation. The flow combiner valves play a role of collecting equal flow or proportional oil return flow from the two execution elements to achieve speed synchronization or definite proportion relation therebetween. The flow divider/combiner valves have the functions of the flow divider valves and the flow combiner valves.

The plate heat exchanger 13 is a heat exchanger formed by the following steps: pressing thin metal plates to heat exchange plates with a certain ripple form; then overlapping the heat exchange plates; and fastening the heat exchange plates with clamping plates and bolts. Thin rectangular channels are formed among various plates for heat exchange through semi-plates. A working fluid flows in a narrow and zigzag channel formed between two plates. Cold and hot fluids pass through the channel in sequence, and the fluids are separated by a middle spacer plate and exchange heat through the plate.

The radiator 14 is of a parallel fluid finned tube structure made from an aluminum material, the fluids circulate inside a row flow, a parallel channel thereof is of a harmonica-shaped tube structure, and thin fins are brazed to the surface, so that the radiating area can be increased.

It should be understood that thermal management in the embodiments of the application refers to cooling or heating the battery 200 through the fluids.

Through the implementation mode, the plate heat exchanger 13, the radiator 14 and the heaters 15 inside the liquid cooling unit 100 are of a parallel structure, and different branches can be selected according to different demands of the battery 200 on heating or refrigerating to work. In some embodiments, the battery can further be jointly cooled by branches of the plate heat exchanger 13 and the radiator 14, so that the cooling efficiency of the liquid cooling unit 100 is improved.

In some embodiments, the liquid cooling unit 100 further includes a compressor 16, a compressor 17 and a cooling fan 18, where the compressor 16, the compressor 17, the cooling fan 18 and the plate heat exchanger are configured to cool the refrigerant. A refrigerant pipeline 19 connected to the compressor 16, the compressor 17 and the plate heat exchanger 13 is integrally welded.

The compressor 17 is a driven fluid machine which boots a low pressure gas to a high pressure gas, which is the heart of the refrigeration system. The compressor sucks the low-temperature and low-pressure refrigerant gas from a gas suction pipe, and the motor runs to drive a piston to compress the refrigerant gas. The compressor discharges a high-temperature and high-pressure refrigerant liquid to an exhaust pipe so as to provide power to refrigeration cycle. The compressor 17 can convert gas or steam into liquid, and transfers heat in the pipe to air surrounding the pipe rapidly.

It is to be noted that the compressor 16, the compressor 17, the cooling fan 18, the plate heat exchanger 13 and the refrigerant pipeline 19 form the compressor refrigeration module 110 of the liquid cooling unit 100 in the embodiments of the application.

In the above implementation modes, the refrigeration pipeline is integrally formed by welding, so that the numbers of a plurality of parts assembled in the refrigerant pipeline 20 and the compressor refrigeration module 110 are reduced, and the installation and maintenance efficiencies of the liquid cooling unit 100 are improved.

It is to be further noted that the liquid circulating in the refrigerant pipeline 19 in the compressor refrigeration module 110 of the liquid cooling unit 100 is the refrigerant. Besides pipelines inside the compressor refrigeration module 110 in the liquid cooling unit 100, the liquids circulating in other pipelines are cooling fluids.

It is to be further noted that the radiator 14, the cooling fan 18 and a cooling fluid pipeline matched therewith form the radiator refrigeration module 120 of the liquid cooling unit 100. The first flow divider/combiner 11, the second flow divider/combiner 12 and the heaters 15 form the heating and cooling fluid pipeline module 130 of the liquid cooling unit 10 in the embodiments of the application.

In some embodiments, the liquid cooling unit further includes a fluid chamber 20, where the fluid chamber is a closed fluid chamber and is configured to provide a fluid to the second flow divider/combiner 12.

It should be understood that the fluid chamber 20 can also be known as a water tank, which is configured to store the fluids.

In the embodiments of the application, the fluids refer to the cooling fluids.

In the above implementation modes, the fluid chamber 20 can be a closed fluid chamber, and it can be ensured that a cooling fluid system is sealed during operation, which is beneficial to guaranteeing cleanness, stability and long-term action of the cooling fluid.

In some embodiments, the fluid chamber 20 can be a closed expanded fluid chamber which can either buffer pressure fluctuation in the system or play an unloading role. In a case where the water pressure in the system changes, the change of the water pressure will be induced thanks to its automatic expanding and shrinking function, thereby playing a buffering role. The expanded fluid chamber can maintain the water pressure stable so as to control the water to not change due to pressure.

In some embodiments, the liquid cooling unit 100 further includes a water pump 21, where the water pump is configured to output the fluid to the battery 200 so as to cool or heat the battery 200.

In some embodiments, there are a plurality of water pumps 21 in the liquid cooling unit 100. For example, the liquid cooling unit 100 shown in FIG. 1 includes five water pumps. The five water pumps are connected in parallel to the second flow divider/combiner 12 and each of the water pumps is connected to one battery 200, so as to cool or heat the battery 200 connected thereto.

In some embodiments, the water pumps 21 are brushless direct current water pumps. Without carbon brush friction, the brushless direct current water pumps do not generate sparks and feature high efficiency, low power consumption, long service life compared with the brush motor and low noise.

It is to be noted that the water pumps 21 are a power source of the whole cooling fluid circulation system, which can control the outlet flow to ensure that peripheral cooling objects (batteries, battery packs, battery boxes and the like) have enough cooling fluid flows and to ensure the consistency of fed flows.

In some embodiments, the water pumps 21 are pulse width modulation (PMW) variable frequency regulation water pumps, which are beneficial to regulating and outputting different cooling fluid flows according to different working condition requirements of the peripheral pipeline system on cooling fluid objects.

In the embodiments of the application, the number of water pumps 21 can be selectively configured according to the number of peripheral batteries 200 to facilitate consideration of demands of various client systems. For example, when a client needs to cool or heat four batteries 200, the number of water pumps 21 in the liquid cooling unit 100 can be set as 4. Of course, the number of water pumps 21 can be subject to redundancy design as well. For example, when a client needs to cool or heat four batteries 200, the number of water pumps in the liquid cooling unit 100 can be set as 5; at the time, the fifth water pump is closed only, and the waterway is plugged with a plug pipeline. In a case where a certain water way fails later, it is adapted to the fifth water pump to recover use rapidly without replacing the unit with a new unit.

In some embodiments, the plate heat exchanger 13, the radiator 14 and the heaters 15 are connected to the first flow divider/combiner 11 and the second flow divider/combiner 12 through rubber hoses.

In some embodiments, the water pumps 21 are connected to the second flow divider/combiner 12 and the batteries 200 through the rubber hoses as well.

In some embodiments, the first flow divider/combiner 11 and the second flow divider/combiner 12 both are provided with normally closed drain valves, configured to conduct drainage and exhaust of a connecting pipeline connected to the first flow divider/combiner and the second flow divider/combiner.

During first time fluid injection or fluid supplementation in after-sales maintenance, in a case where there are bubbles in the pipelines inside the liquid cooling unit 100, the flowing stability of the cooling fluid inside the fluid cooling unit 100 and the water pressure sampling stability will be affected. By arranging the normally closed drain valves on the first flow divider/combiner 11 and the second flow divider/combiner 12, drainage and exhaust of the pipelines inside the liquid cooling unit 100 are conducted.

In some embodiments, the first flow divider/combiner 11 and the second flow divider/combiner 12 both are integrally formed by welding.

In some embodiments, in a case where an environment temperature is lower than a first threshold, the cooling fan 18 is started to cool the fluid inside the radiator 14.

It should be understood that in a case where the liquid cooling unit 100 works in an environment with the temperature lower than a certain threshold, for example 15° C., the cooling fluid can be cooled by utilizing the radiator refrigeration module 120, so that the batteries 200 are cooled. The specific cooling way by utilizing the radiator refrigeration module 120 refers to starting the cooling fan 18 and the water pumps 21, where the cooling fan 18 ventilates to cool the cooling fluid inside the row flow of the radiator. The radiator refrigeration module 120 can either work independently or jointly work with the refrigerant refrigeration module 130 to cool the batteries 200, which is not defined herein.

In the above implementation modes, the power consumption of the cooling fan 18 and the water pumps 21 working jointly is far less than that of the compressor refrigeration module 110. Power of the radiator and the water pumps is usually hectowatt, and the electric power of the compressor refrigeration module 110 is higher than kilowatt. Therefore, the power consumption of the liquid cooling unit 100 can be reduced by utilizing the radiator refrigeration module 120.

Figure 2:
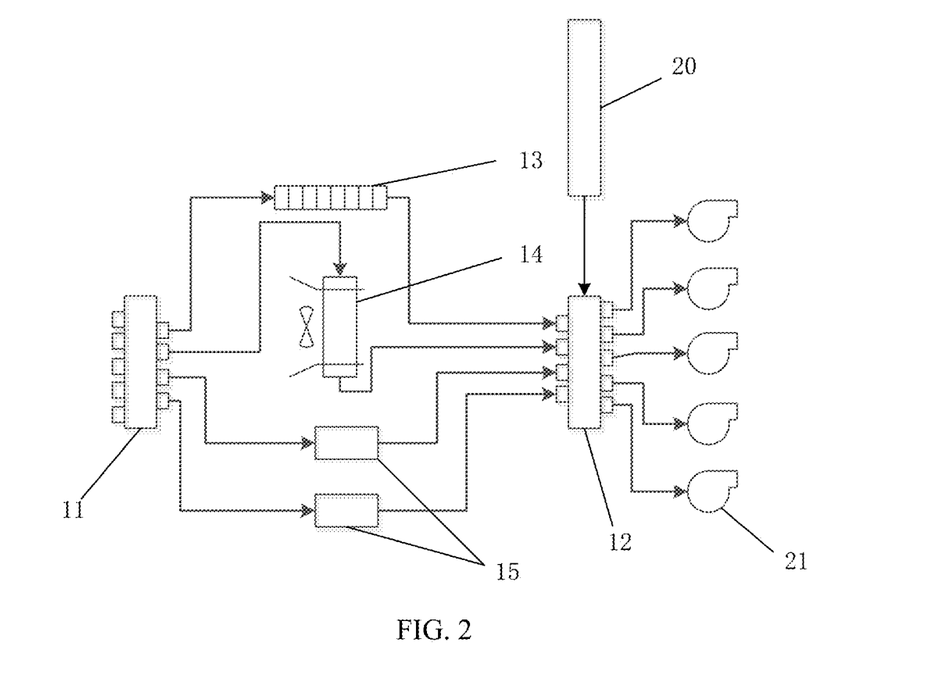
FIG. 2 is a connecting schematic diagram of a cooling fluid loop of the liquid cooling unit provided in some embodiments of the application.

To facilitate understanding of the flow direction of the cooling fluid of the liquid cooling unit in the embodiments of the application, FIG. 2 shows the cooling fluid loop of the liquid cooling unit 100 provided by the embodiments of the application. The connecting pipelines all in FIG. 2 are cooling fluid pipelines, and arrows are flow directions of the cooling fluid.

In some embodiments, there are a plurality of heaters 15.

Through the implementation mode, the number of the heaters 15 can be set according to the actual demand. For example, when the batteries are in an environment with low temperature, the plurality of heaters 15 can be arranged and connected in parallel between the first flow divider/combiner 11 and the second flow divider/combiner 12 to heat the batteries 200 jointly, so that the heating efficiency of the liquid cooling unit 100 is improved.

Exemplarily, there are two heaters 15 in the liquid cooling unit 100 shown in FIG. 2, and the heaters are connected in parallel between the first flow divider/combiner 11 and the second flow divider/combiner 12. Therefore, the first flow divider/combiner 11 includes four flow dividing ends. Further, it can be known that when there are three heaters, the first flow divider/combiner 11 includes five flow dividing ends. The flow dividing ends of the first flow divider/combiner can be set or manufactured as required.

To facilitate understanding of the working flow of the refrigeration and cooling fluid pipeline in the liquid cooling unit 100, the working flow is introduced by the following embodiments.

In some embodiments, in a case where the temperature of the battery 200 is higher than a certain threshold, in order to prevent thermo-runaway of the battery 200, the battery 200 needs to be cooled. At the time, the water pump 21 corresponding to the battery is opened, the fluid chamber 20 provides the cooling fluid to the second flow divider/combiner 12, and the cooling fluid flows to the battery 200 from the water pump 21 so as to cool the battery 200. The cooling fluid cooling the battery 200 flows into the first flow divider/combiner 11 through the cooling fluid pipeline 300 outside the liquid cooling unit 100. At the time, whether the external temperature is less than the first threshold is determined. In a case where the external temperature is less than the first threshold, the first flow divider/combiner 11 outputs the cooling fluid to the plate heat exchanger 13 and the radiator 14, and the cooling fan 18 is started. In the branch of the plate heat exchanger, the cooling fluid flowing through is cooled by the plate heat exchanger 13; in the branch of the radiator, the cooling fan 18 cools the cooling fluid inside the row flow of the radiator 14 and then transports the cooled cooling fluid to the second flow divider/combiner 12 to further circularly cool the battery 200. In a case where the external temperature is not less than the first threshold, the first flow divider/combiner 11 only outputs the cooling fluid to the plate heat exchanger 13.

In some embodiments, in a case where the temperature of the battery 200 is LOWER than a certain threshold, for example, the temperature of the battery 200 is lower than the temperature of the cooling fluid, the battery 200 needs to be heated. At the time, the water pump 21 corresponding to the battery is opened, the fluid chamber 20 provides the cooling fluid to the second flow divider/combiner 12, and the cooling fluid flows to the battery 200 from the water pump 21 so as to heat the battery 200. The cooling fluid heating the battery 200 flows into the first flow divider/combiner 11 through the cooling fluid pipeline 300 outside the liquid cooling unit 100. The first flow divider/combiner 11 outputs the cooling fluid to the heaters 15, the heaters 15 heat the cooling fluid, and then the heated cooling fluid is transported to the second flow divider/combiner 12 to further circularly heat the battery 200.

It is to be noted that when the battery 200 is heated, the first flow divider/combiner 11 can output the cooling fluid to one or more heaters 15 according to actual working condition requirements, which is not defined herein.

Figure 3:
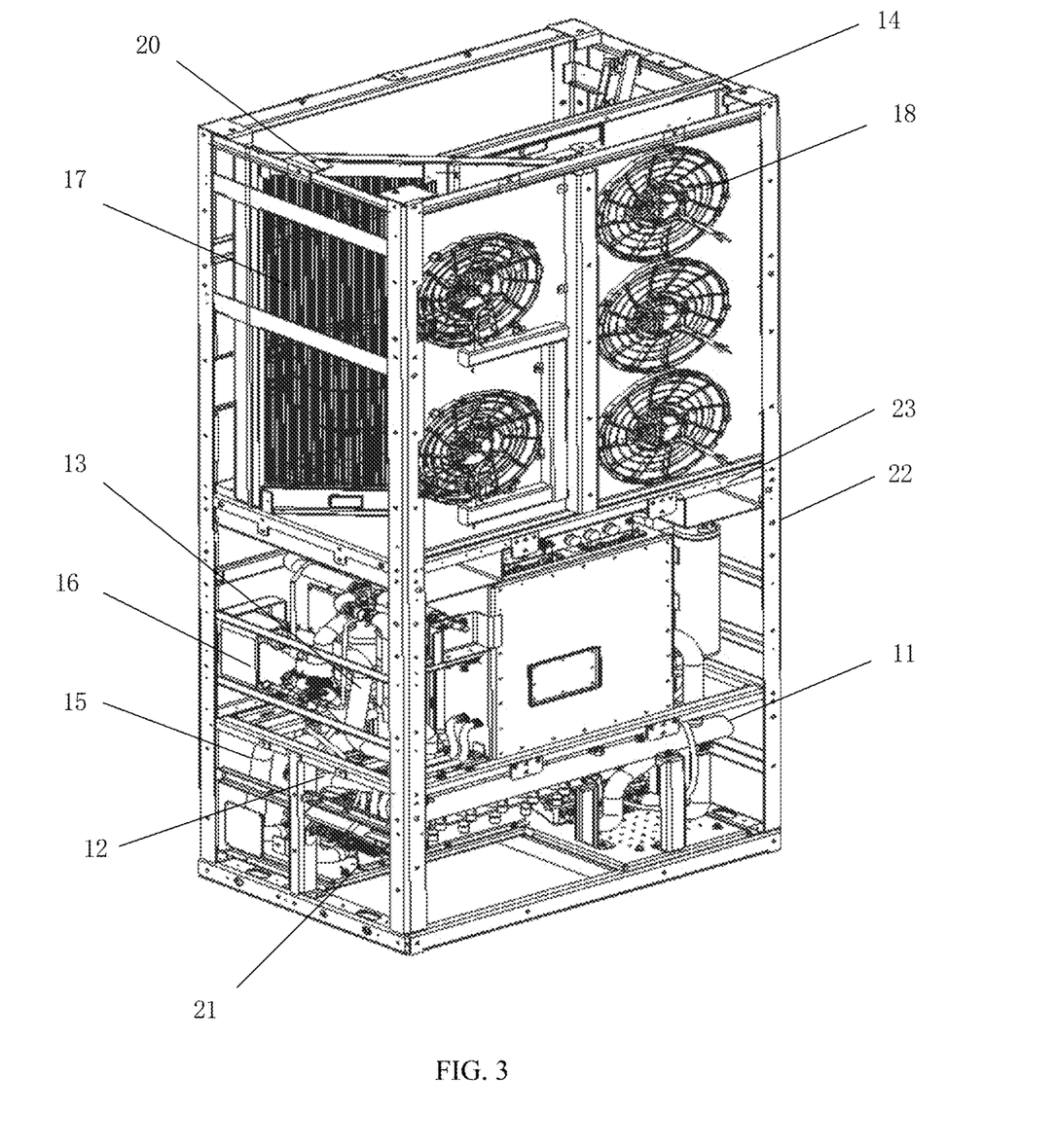
FIG. 3 is a structural schematic diagram of the liquid cooling unit provided in some embodiments of the application.

FIG. 3 shows a structural schematic diagram of a liquid cooling unit 100 in the embodiments of the application.

In some embodiments, the way of assembly of parts inside the liquid cooling unit 100 is shown in FIG. 3. All parts of the liquid cooling unit 100 are fixed into a metal plate frame 22 provided with a forklift port 23 for facilitating transportation or carrying the liquid cooling unit 100 to an application site.

In some embodiments, the interior of the liquid cooling unit 100 can be divided into three layers: the radiator 14, the compressor 17, the fluid chamber 20 and the cooling fan 18 in the uppermost layer; the plate heat exchanger 13 and the compressor 16 in the middle layer; and the first flow divider/combiner 11, the second flow divider/combiner 12, the heaters 15 and the water pumps 21 in the bottommost layer.

The fluid chamber 20 is arranged in the uppermost layer inside the liquid cooling unit 100, which is beneficial to improving the water pressure.

In other embodiments, fixed positions of the above parts all are merely exemplary, and the positions and ways in actual fixation can be re-arranged according to working conditions or client demands, which is not defined herein.

In the above implementation modes, all parts cooling or heating the batteries 200 form the integrated liquid cooling unit 100, which solves the problems of complex pipelines, low cooling efficiency and the like caused by a conventional split indoor-outdoor unit design solution, and further solves the problem that the part type liquid cooling unit features large occupied space and high field installation and maintenance costs. In some embodiments, it is beneficial to controlling batch production of the liquid cooling unit 100, so that the liquid cooling unit has industrial use value.

The above embodiments are merely used to describe the technical scheme of the application and are not used to limit the application. For those skilled in the art, various alternations and changes can be made on the application. Any modification, equivalent replacement, improvement, etc. made within the spirit and principle of the application shall be regarded as within the scope of the application.

What is claimed is:
1. A liquid cooling unit, comprising:
   a first flow divider/combiner;
   a second flow divider/combiner;
   a plate heat exchanger;
   a radiator; and
   a heater;
   wherein
   the plate heat exchanger, the radiator and the heater are connected in parallel between a flow dividing end of the flow divider/combiner and a flow combining end of the second flow divider/combiner;
   the flow dividing end of the first flow divider/combiner is configured to output a fluid into at least one of the plate heat exchanger, the radiator and the heater;
   the plate heat exchanger and the radiator are configured to cool the fluid, and the heater is configured to beat the fluid;
   the flow combining end of the second flow divider/combiner is configured to receive the fluid outputted by at least one of the plate heat exchanger, the radiator and the heater, and the flow dividing end of the second flow divider/combiner is configured to output the fluid to a battery for thermal management of the battery; and
   the flow combining end of the first flow divider/combiner is configured to receive the fluid after thermal management of the battery;
   wherein the first flow divider/combiner and the second flow divider/combiner both are provided with normally closed drain valves, configured to conduct drainage and exhaust of a connecting pipeline connected to the first flow divider/combiner and the second flow divider/combiner.

2. The liquid cooling unit according to claim 1, wherein the liquid cooling unit further comprises a compressor, a condenser and a cooling fan;

the compressor, the condenser, the plate heat exchanger and the cooling fan are configured to cool a refrigerant; and a refrigerant pipeline connected to the compressor, the condenser and the plate heat exchanger are integrally welded.

3. The liquid cooling unit according to claim 2, wherein the liquid cooling unit further comprises:

a fluid chamber, the fluid chamber being a closed fluid chamber and being configured to provide a fluid to the second flow divider/combiner.

4. The liquid cooling unit according to claim 3, wherein the liquid cooling unit further comprises:

a water pump, the water pump being configured to output the fluid to the battery.

5. The liquid cooling unit according to claim 4, wherein the water pump is a brushless direct current water pump.

6. The liquid cooling unit according to claim 1, wherein there are a plurality of heaters.

7. The liquid cooling unit according to claim 1, wherein the plate heat exchanger, the radiator and the heater are connected to the first flow divider/combiner and the second flow divider/combiner through rubber hoses.

8. The liquid cooling unit according to claim 1, wherein the first flow divider/combiner and the second flow divider/combiner both are integrally formed by welding.

9. The liquid cooling unit according to claim 1, wherein in a case where an environment temperature is lower than a first threshold, the cooling fan is started to cool the fluid inside the radiator.

* * * * *